(12) United States Patent
Silveira et al.

(10) Patent No.: US 12,278,094 B2
(45) Date of Patent: Apr. 15, 2025

(54) METHODS AND APPARATUS FOR PROCESSING A SUBSTRATE

(71) Applicant: APPLIED MATERIALS, INC., Santa Clara, CA (US)

(72) Inventors: Fernando Silveira, Livermore, CA (US); Richard Fovell, San Jose, CA (US); Chunlei Zhang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1035 days.

(21) Appl. No.: 16/870,438

(22) Filed: May 8, 2020

(65) Prior Publication Data
US 2021/0351021 A1    Nov. 11, 2021

(51) Int. Cl.
*H01J 37/32*    (2006.01)
(52) U.S. Cl.
CPC .. *H01J 37/32724* (2013.01); *H01J 37/32522* (2013.01); *H01J 2237/334* (2013.01)
(58) Field of Classification Search
None
See application file for complete search history.

(56) References Cited

U.S. PATENT DOCUMENTS

| | | | |
|---|---|---|---|
| 9,338,871 B2 | 5/2016 | Mahadeswaraswamy et al. | |
| 9,852,888 B2 | 12/2017 | Goto | |
| 9,912,258 B2 | 3/2018 | Park et al. | |
| 10,490,429 B2 | 11/2019 | Criminale et al. | |
| 2004/0187787 A1 | 9/2004 | Dawson et al. | |
| 2007/0074863 A1 | 4/2007 | Ichinose et al. | |
| 2009/0118872 A1* | 5/2009 | Nonaka | G05D 23/1934 700/285 |
| 2012/0048467 A1 | 3/2012 | Mahadeswaraswamy et al. | |

(Continued)

FOREIGN PATENT DOCUMENTS

| | | |
|---|---|---|
| JP | 2011503877 A | 1/2011 |
| KR | 100765983 B1 | 10/2007 |

(Continued)

OTHER PUBLICATIONS

International Search Report and Written Opinion of the International Search Report for application No. PCT/US2021/024765 dated Jul. 19, 2021.

*Primary Examiner* — Jeffrie R Lund
*Assistant Examiner* — Tiffany Z Nuckols
(74) *Attorney, Agent, or Firm* — Moser Taboada (57) ABSTRACT

Methods and apparatus of controlling a temperature of components in a process chamber that is heated by a plasma or a heater and cooled by a coolant flow through a heat exchanger. An apparatus, for example, can include a chuck assembly and/or a plasma source including a respective cooling plate; a proportional bypass valve connected between the respective cooling plate and a heat exchanger; a temperature sensor configured to measure a temperature of the coolant through the outlet channel of the respective cooling plate; and a controller that receives a measured temperature from the temperature sensor measuring, and in response to receiving the measured temperature controls a rate of flow of the coolant through the first coolant output line and the second coolant output line of the proportional bypass valve.

19 Claims, 6 Drawing Sheets

(56) References Cited

U.S. PATENT DOCUMENTS

| | | | | |
|---|---|---|---|---|
| 2013/0105081 A1* | 5/2013 | Silveira | ............ | H01J 37/32724 |
| | | | | 156/345.52 |
| 2016/0148822 A1* | 5/2016 | Criminale | ......... | H01L 21/67109 |
| | | | | 165/104.34 |
| 2017/0323813 A1* | 11/2017 | Silveira | ................... | C23C 16/50 |
| 2019/0035609 A1 | 1/2019 | Tobe | | |
| 2019/0214279 A1* | 7/2019 | Marcacci | .......... | H01L 21/67248 |
| 2019/0256977 A1 | 8/2019 | Doble et al. | | |
| 2019/0310034 A1* | 10/2019 | Kobayashi | ........ | H01L 21/67253 |
| 2019/0348306 A1* | 11/2019 | Koltonski | ............. | F28D 1/0213 |
| 2020/0117223 A1* | 4/2020 | Kobayashi | ............. | F25B 41/20 |

FOREIGN PATENT DOCUMENTS

| | | |
|---|---|---|
| WO | WO 2007/148850 A1 | 12/2007 |
| WO | WO 2017/192211 A1 | 3/2017 |
| WO | WO2021054185 A1 | 3/2021 |

\* cited by examiner

METHODS AND APPARATUS FOR PROCESSING A SUBSTRATE

Embodiments of the present disclosure generally relate to methods and apparatus for processing substrates, and more particularly, to methods and apparatus for controlling a temperature of components in a processing chamber during processing of a substrate.

BACKGROUND

In a plasma processing chamber, such as a plasma etch or plasma deposition chamber, during operation a temperature of components disposed within the processing chamber (e.g., a substrate, a substrate support, a source, etc.) is an important parameter that controls the effectiveness or speed of the plasma process. For example, a temperature of a chuck assembly disposed on a substrate support that supports a substrate or a source (e.g., a target, showerhead, etc.) can be controlled using a temperature control system to adjust for particular set points of a process recipe during a plasma process, e.g., to heat or cool components, for controlling an etch/deposition rate.

Moreover, as microelectronic features are made smaller so that dies and the resulting products can be made smaller, more precision of temperature control is required during plasma processing. For example, higher power plasmas generate a relatively large amount of heat and, typically, require more effective cooling. As a result, the temperature control system must be very accurate and operate over a wide range of temperatures to support different processes.

Furthermore, while conventional temperature control systems are suitable for providing a coolant to chamber components, such systems are not configured to control a temperature of the coolant prior to the coolant returning to a heat exchanger of the temperature control system, which can lead to damage to the heat exchanger and/or increased cooling time of the coolant at the heat exchanger.

SUMMARY

Methods and apparatus of controlling a temperature of components in a process chamber that is heated by a plasma or a heater and cooled by a coolant flow through a heat exchanger are provided herein. In some embodiments, a processing chamber includes at least one of a chuck assembly or a plasma source including a respective cooling plate, the respective cooling plate including coolant channels having an inlet channel coupled to a coolant supply line of a heat exchanger and an outlet channel that connects to a coolant return line of the heat exchanger; a proportional bypass valve connected between the respective cooling plate and the heat exchanger and including a coolant input line that connects to the coolant supply line, a first coolant output line that connects to the inlet channel of the respective cooling plate, and a second coolant output line that connects to the coolant return line; a temperature sensor configured to measure a temperature of the coolant through the outlet channel of the respective cooling plate; and a controller that receives a measured temperature from the temperature sensor measuring, and in response to receiving the measured temperature controls a rate of flow of the coolant through the first coolant output line and the second coolant output line of the proportional bypass valve.

In accordance with at least some embodiments, a method of controlling a temperature of components in a process chamber that is heated by a plasma or a heater and cooled by a coolant flow through a heat exchanger includes generating a plasma in a processing chamber using a plasma source; directing the plasma toward a chuck assembly configured to support a substrate; providing a coolant from a heat exchanger via a proportional bypass valve connected to a respective cooling plate of at least one of the chuck assembly or the plasma source; measuring a temperature of the coolant through an outlet channel of the respective cooling plate; and in response to receiving a measured temperature, controlling a rate of flow of the coolant through a first coolant output line and a second coolant output line of the proportional bypass valve.

In accordance with at least some embodiments, a non-transitory computer readable storage medium having instructions stored thereon that when executed by a processor perform a method of controlling a temperature of components in a process chamber that is heated by a plasma or a heater and cooled by a coolant flow through a heat exchanger. The method includes generating a plasma in a processing chamber using a plasma source; directing the plasma toward a chuck assembly configured to support a substrate; providing a coolant from a heat exchanger via a proportional bypass valve connected to a respective cooling plate of at least one of the chuck assembly or the plasma source; measuring a temperature of the coolant through an outlet channel of the respective cooling plate; and in response to receiving a measured temperature, controlling a rate of flow of the coolant through a first coolant output line and a second coolant output line of the proportional bypass valve.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for controlling temperature of one or more components in a processing chamber are provided herein. More particularly, the methods, for example, include receiving a measured temperature of a coolant through an outlet channel of process components, and in response to receiving the measured temperature controlling a rate of flow of the coolant through a first coolant output and a second coolant output of a proportional bypass valve connected to a cooling plate of the process components. The methods and apparatus described herein significantly reduce process time, reduce a risk of arcing e.g., by eliminating a need to re-strike plasma, increase throughput, and provide improved thermal control.

Figure 1A:
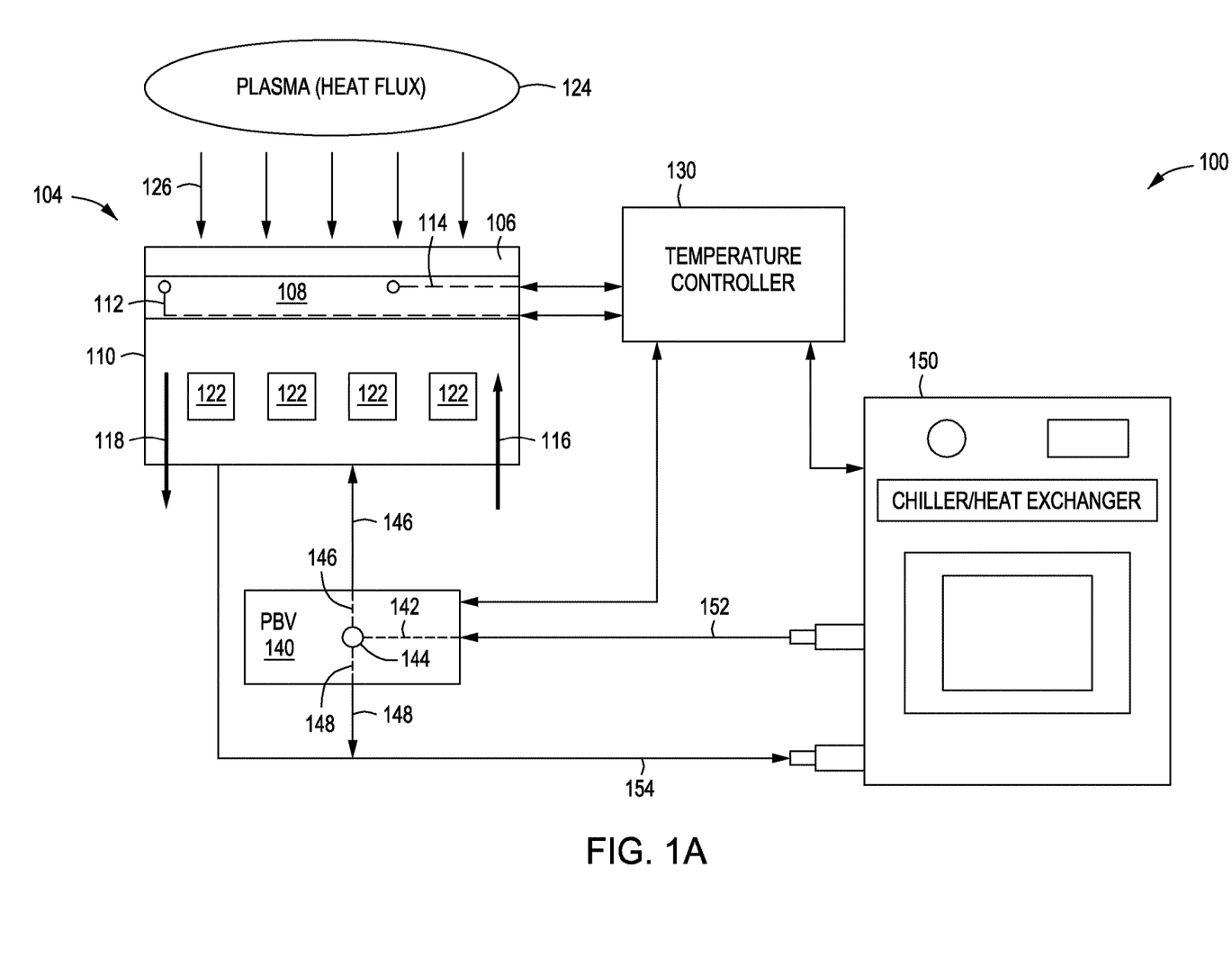
FIG. 1A is a diagram of a temperature control system, in accordance with at least some embodiments of the present disclosure.

FIG. 1A is a diagram of a temperature control system 100 (control system 100), in accordance with at least some embodiments of the present disclosure. In FIG. 1A, the control system 100 is described in terms of use with an electrostatic chuck (ESC) 104 (e.g., a chuck assembly). The ESC 104 supports a substrate 106 in one or more types of processing chambers (e.g., a plasma 124 processing chamber), as described in greater detail below. While the present disclosure describes an ESC in the context of a plasma processing chamber, the ESC described herein may be used in a variety of different chambers and for a variety of different processes. A different substrate support may be used instead of an ESC, depending on a particular implementation of the control system 100.

The control system 100 includes one or more proportional bypass valves 140 (PBV 140), which can be configured to continuously adjust flow of coolant therethrough. A temperature controller 130, such as a multiple input multiple output (MIMO) controller or any other type of controller, is configured to control the valves of the PBV 140 and regulate a temperature of the ESC 104 and/or the substrate 106 supported by the ESC 104. More particularly, the temperature controller 130 is configured to receive temperature measurements from one or more sensors/probes 112, 114, such as optical temperature sensors, of the ESC 104 as feedback to control a temperature of the ESC 104 and/or the substrate 106 as well as flow or ramp rate of a coolant through the ESC 104, as described in greater detail below. The coolant can be any fluid suitable for cooling an upper plate 108 of the ESC 104 and/or the substrate 106. For example, in at least some embodiments, the coolant can include, but is not limited to, water, deionized water/ethylene glycol, a fluorinated coolant such as Fluorinert® from 3M or Galden® from Solvay Solexis, Inc. or any other suitable fluids such as those containing perfluorinated inert polyethers.

Continuing with reference to FIG. 1A, the ESC 104 includes the upper plate 108 (e.g., a substrate support) that is configured to support the substrate 106, such as a silicon wafer or other type of substrate. The upper plate 108 is supported on a cooling plate 110, and one or more other supports (not shown), which can be provided below the cooling plate 110, can be configured to move and support the substrate 106 and to provide gases, electrical current, and/or other materials to the upper plate 108 and/or the substrate 106.

During some substrate processes, e.g., etch, deposition, etc., heat 126 can be applied to the upper plate 108 and/or substrate 106 from the plasma 124 and/or by one or more other elements and components suitable for heating the upper plate 108 and/or the substrate 106, such as heaters (not shown), within a processing chamber. The heat 126 is conducted, at least in part, through the substrate 106 to the upper plate 108 and to the cooling plate 110. The upper plate 108 includes the sensors 112, 114 that are configured to measure a temperature at or near the substrate 106.

The cooling plate 110 includes one or more coolant channels that receive coolant via one or more inlet channels and that release the coolant via one or more output channels. For illustrative purposes, a plurality of coolant channels 122 are shown in the cooling plate 110. Providing a plurality of coolant channels 122 allows a temperature of different parts of the cooling plate 110 to be independently controlled. For example, as a periphery of the ESC 104 tends to get hotter than a center of the ESC 104, a separate peripheral or outer fluid channel can allow more coolant to be applied to the periphery of the ESC 104. The cooling plate 110 can include one or more inlet channels 116 and one or more output channels 118 (arrows are used to illustrate an inlet channel 116 and output channel 118). The inlet channel 116 connects to a first coolant output line of the PBV and the output channel 118 connects to a return line of a heat exchanger.

One or more heat exchangers of the temperature controller 130 are configured to provide coolant to the ESC 104. For example, in at least some embodiments, a heat exchanger 150 includes a coolant supply line 152 and a coolant return line 154 for respectively providing coolant to and receiving coolant from the ESC 104. The heat exchanger 150 receives the return coolant and cools the return coolant to a predetermined temperature or by a regulated amount. The heat exchanger 150 may be thermostatically controlled or the heat exchanger 150 may apply a fixed amount of cooling based on a specific design of a processing chamber. The temperature of the coolant that is circulated through the ESC 104 is controlled by the temperature of the supplied coolant and by a flow rate of the coolant through the ESC 104, e.g., circulating through the plurality of coolant channels 122 during operation.

The PBV 140 is connected between the ESC 104 and the heat exchanger 150. The PBV 140 includes a coolant input line 142 that is connected to the coolant supply line 152 of the heat exchanger 150. The coolant input line 142 is connected to a valve 144, which is connected to a first coolant output line 146 (shown in phantom inside the PBV 140) that connects to the inlet channel 116 of the ESC 104 and a second coolant output line 148 (also shown in phantom inside the PBV 140) that connects to the coolant return line 154 of the heat exchanger 150. The valve 144 includes multiple ports (not shown, e.g., at least two ports) that are controlled by the temperature controller 130 to control a flow path of the coolant through the PBV 140, as described in greater detail below.

The temperature controller 130 receives a temperature measurement/signal from the sensors 112, 114 to determine a temperature of the upper plate 108 and/or the substrate 106. Based on the received temperature measurement, the temperature controller 130 opens and closes the multiple ports of the valve 144 in the PBV 140 to control a flow path of coolant through the PBV 140 and flow rate of coolant through the plurality of coolant channels 122 of the ESC 104. More particularly, using the received temperature measurement, the temperature controller 130 can generate valve control signals, e.g., analog voltages, digital pulse width modulated (PWM) signals, and/or pneumatic signals, and supplies the control signals to the PBV 140. Additionally, the temperature controller 130 can also receive pressure, temperature, and/or other signals from the PBV 140 and the sensors 112, 114, which can be used to control one or more valves disposed within the heat exchanger 150 and/or a temperature of the coolant provided by the heat exchanger 150.

Figure 1B:
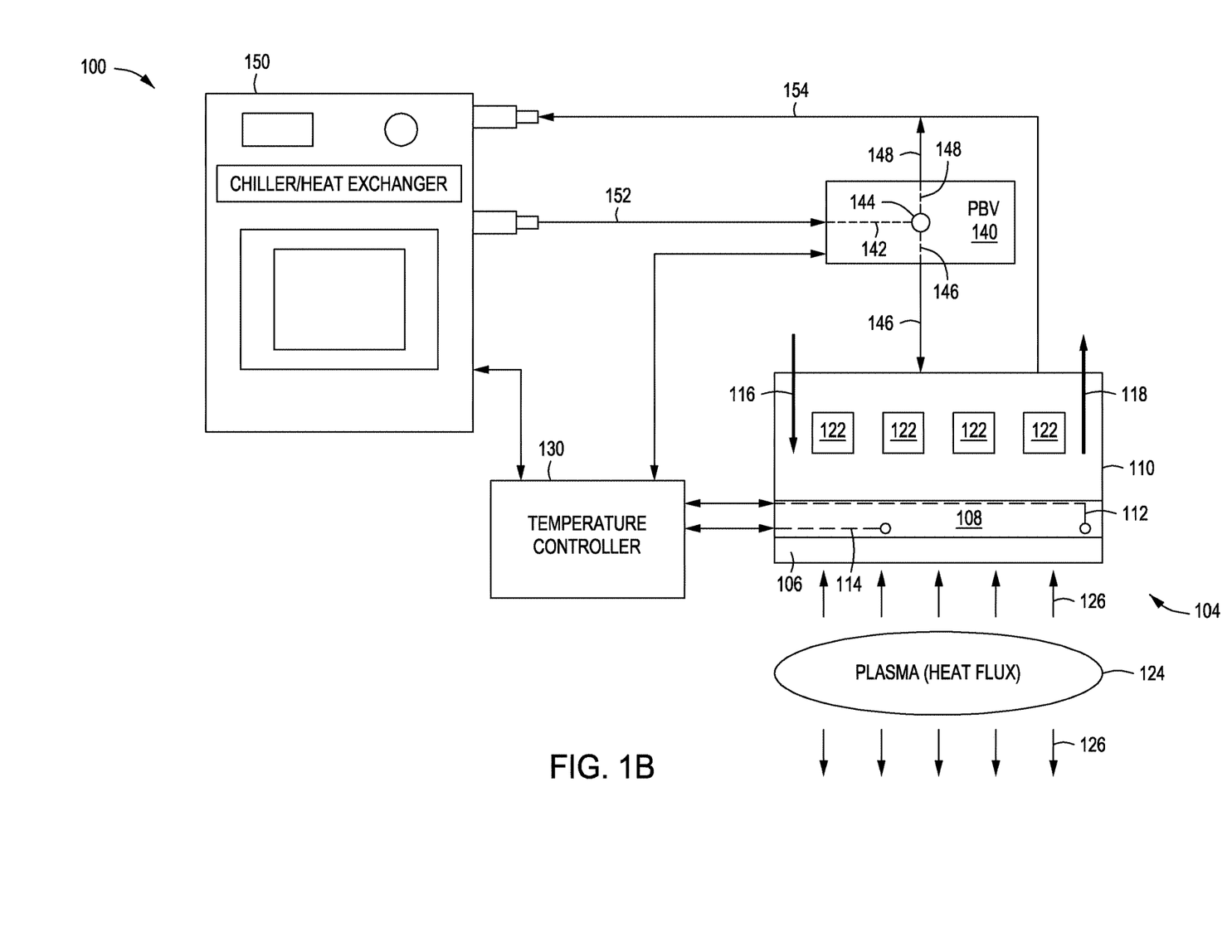
FIG. 1B is a diagram of a temperature control system, in accordance with at least some embodiments of the present disclosure.

FIG. 1B is a diagram of the control system 100, in accordance with at least some embodiments of the present disclosure. For illustrative purposes, the heat exchanger 150 is shown with the coolant supply line 152 and the coolant return line 154 on a top portion of the heat exchanger 150.

The control system 100 functions substantially similar to that as previously described with respect to FIG. 1A. Accordingly, only those features unique to the features of FIG. 1B are herein described. For example, the control system 100 can also be configured to control a temperature of one or more other components in a processing chamber. For example, as illustrated in FIG. 1B, the temperature controller 130 can be configured to control a temperature of a source 160 (e.g., a target, a showerhead, or other process component) within a processing chamber. As with the ESC 104, during processing, a temperature of the source 160 tends to increase, e.g., due to heat 126 from the plasma 124. Accordingly, instead of the cooling plate 110 being coupled to the ESC 104, the cooling plate 110 can be coupled to the source 160. For example, in at least some embodiments, such as when the source 160 is a showerhead assembly, the cooling plate 110 can be coupled to a blocker plate 161 and/or a gas distribution plate 162, such as a showerhead. For example, in at least some embodiments, the cooling plate 110 can be coupled to the blocker plate 161. In such an embodiment, the sensors 112, 114 can be coupled to the blocker plate 161 or the gas distribution plate 162. For example, in at least some embodiments, the sensors 112, 114 can be coupled to the blocker plate 161. During processing, a temperature of the blocker plate 161 and/or the gas distribution plate 162 is controlled/monitored via the coolant being supplied to thereto, as described in greater detail below.

Figure 2:
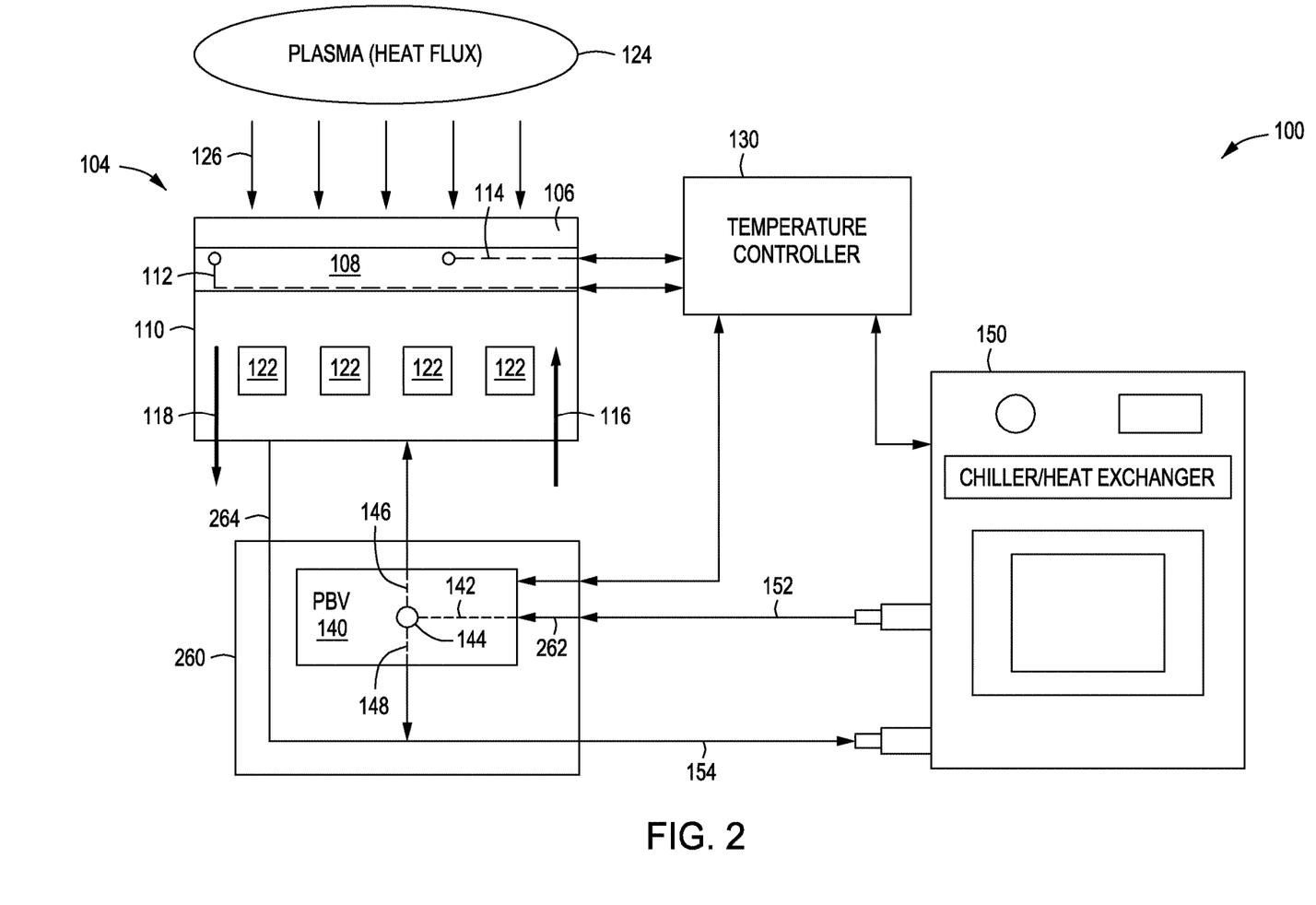
FIG. 2 is a diagram of a temperature control system, in accordance with at least some embodiments of the present disclosure.

FIG. 2 is a diagram of a control system 200, in accordance with at least some embodiments of the present disclosure. The control system 200 can be configured to operate with either the ESC 104 and/or the source 160, but for illustrative purposes, the control system 200 is described in terms of use with the ESC 104. For example, the PBV 140 can be incorporated into a hybrid water interface box (wFib) 260. The control system 200 including the PBV 140 incorporated into the hybrid wFib 260 functions substantially similar to the control system 100 of FIGS. 1A and 1B. Accordingly, only those aspects that are unique to the control system 200 of FIG. 2 are described herein.

The hybrid wFib 260 can include one or more of coolant fluid lines, pneumatic valves, which can act as a shut off valve and/or as a pulsing valve for flow rate control in one or more modes (e.g., a PWM mode), tees, fluid distribution manifolds, etc. Unlike in FIGS. 1A and 1B where the coolant input line 142 of the PBV 140 is directly connected to the coolant supply line 152 of the heat exchanger 150 and the second coolant output line 148 of the PBV 140 is directly connected to the coolant return line 154 of the heat exchanger 150, the coolant input line 142 and the second coolant output line 148 are connected to one or more components of the hybrid wFib 260, e.g., coolant lines within the hybrid wFib 260. For illustrative purposes, the coolant input line 142 of the PBV 140 is shown connected to a coolant supply line 262 of the hybrid wFib 260, which is connected to the coolant supply line 152 of the heat exchanger 150, and the second coolant output line 148 of the PBV 140 is shown connected to a coolant return line 264 of the hybrid wFib 260, which is connected to the coolant return line 154 of the heat exchanger 150.

Additionally, the temperature controller 130 can be connected to the PBV 140 and the hybrid wFib 260 for controlling the hybrid wFib 260 during use. For example, the temperature controller 130 is configured to open and close one or valves within the hybrid wFib 260 to control a flow path of coolant therethrough and a flow rate of coolant through the plurality of coolant channels 122 of the ESC 104.

Figure 3:
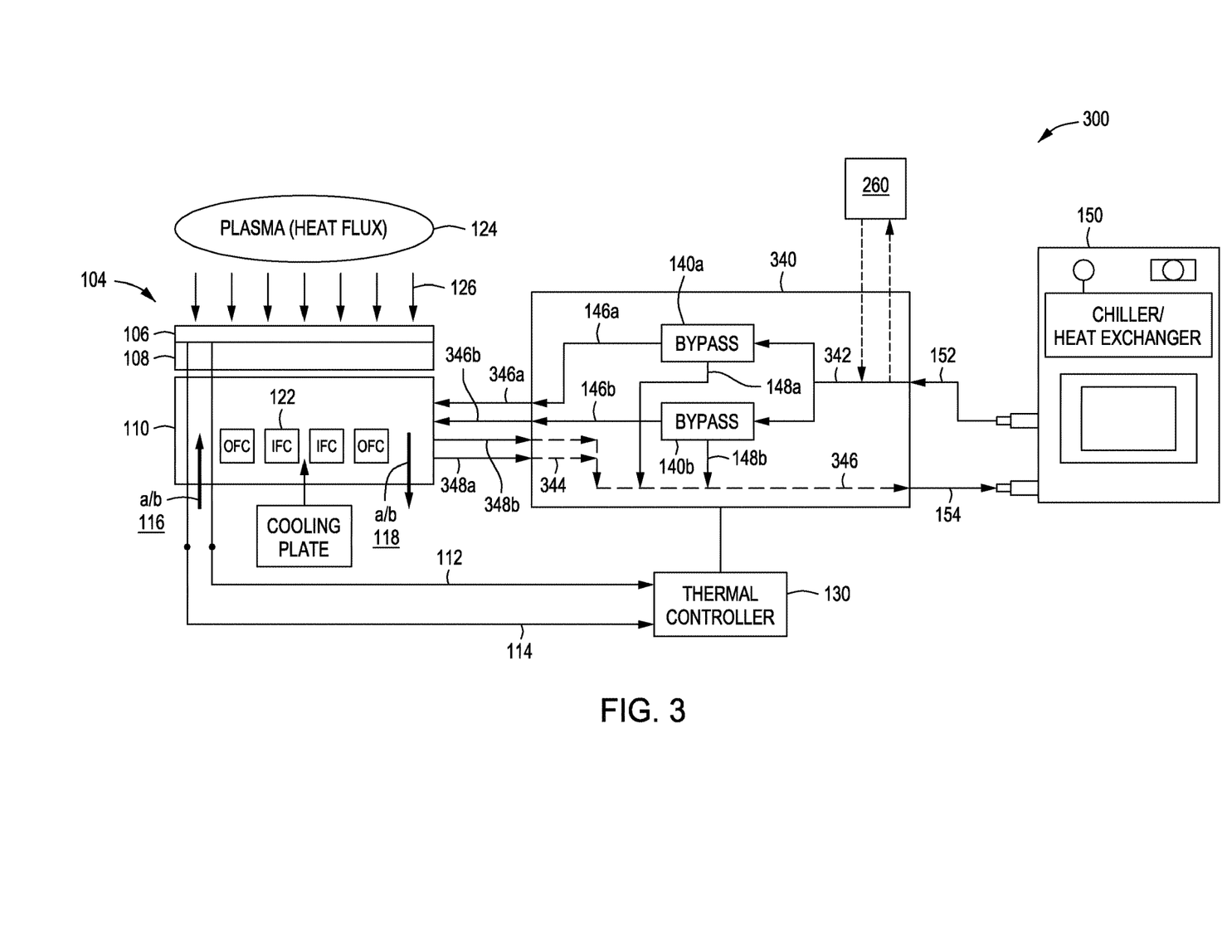
FIG. 3 is a diagram of a temperature control system, in accordance with at least some embodiments of the present disclosure.

FIG. 3 is a diagram of a control system 300, in accordance with at least some embodiments. More particularly, the control system 300 of FIG. 3 illustrates a two zone (or two loop) system with two independent coolant flow zones. The control system 300 can be configured to operate with either the ESC 104 and/or the source 160, but for illustrative purposes, the control system 300 is described in terms of use with the ESC 104. In such an embodiment, one or more PBVs 140 can be used in a manner as previously described. For example, in at least some embodiments, two independently controlled PBVs (e.g., two PBVs 140) can be connected to the coolant supply line 152 and the coolant return line of the heat exchanger 150. For illustrative purposes, two PBVs 140*a* and 140*b* are shown disposed within a PBV housing 340 that is connected to the temperature controller 130. Alternatively, the two PBVs 140*a* and 140*b* can be two separate PBVs not housed within a PBV housing, such as described above with respect to FIGS. 1A and 1B.

Each of the PBVs 140*a*, 140*b* are connected to the heat exchanger 150. For example, in at least some embodiments, the coolant supply line 152 of the heat exchanger 150 supplies coolant to each of the PBVs 140*a*, 140*b* via, for example, a tee 342 disposed within the PBV housing 340 and that connects to respective ones of coolant input lines (not shown) of each of the PBVs 140*a*, 140*b*. Alternatively, two separate coolant supply lines 152 can supply coolant to a respective one of the coolant supply lines of each of the PBVs 140*a*, 140*b*. Similarly, each of respective ones of first coolant output lines 146*a*, 146*b* of each of the PBVs 140*a*, 140*b* are connected to first coolant output lines 346*a*, 346*b* of the PBV housing 340 which are in turn connected to respective ones of the inlet channels 116*a*, 116*b*. The inlet channels 116*a*, 116*b* supply the coolant to independent ones of the plurality coolant channels 122 within the cooling plate 110. The coolant can be returned from the cooling plate 110 via output channels 118*a*, 118*b* which are connected to respective ones of coolant return lines 348*a*, 348*b*. The coolant return lines 348*a*, 348*b* may be combined at any point after exiting the ESC 104. For example, in at least some embodiments, the coolant return lines 348*a*, 348*b* can be combined at a reverse tee 344 that connects to a coolant return line 346 of the PBV housing 340 that connects to the coolant return line 154 of the heat exchanger 150. Moreover, each of the PBVs 140*a*, 140*b* includes a respective second coolant return line 148*a*, 148*b* that connect to the coolant return line 346.

In at least some embodiments, as noted above, since a periphery of the ESC 104 tends to get hotter than a center of the ESC 104, one of the inlet channels 116*a*, 116*b* can connect to a separate peripheral or outer fluid channel (OFC) of the plurality of coolant channels 122, while the other one of the inlet channels 116*a*, 116*b* can connect to a center or inner fluid channel (IFC) of the plurality of coolant channels 122.

In at least some embodiments, a hybrid wFib 260 can be connected to or disposed within the PBV housing 340. In such an embodiment, the hybrid wFib 260 can be connected between the tee 342 and the heat exchanger 150 such that the coolant path is from the coolant supply line 152 of the heat exchanger 150 to the hybrid wFib 260 then to the tee 342, and then to each of the PBVs 140*a*, 140*b*.

Figure 4:
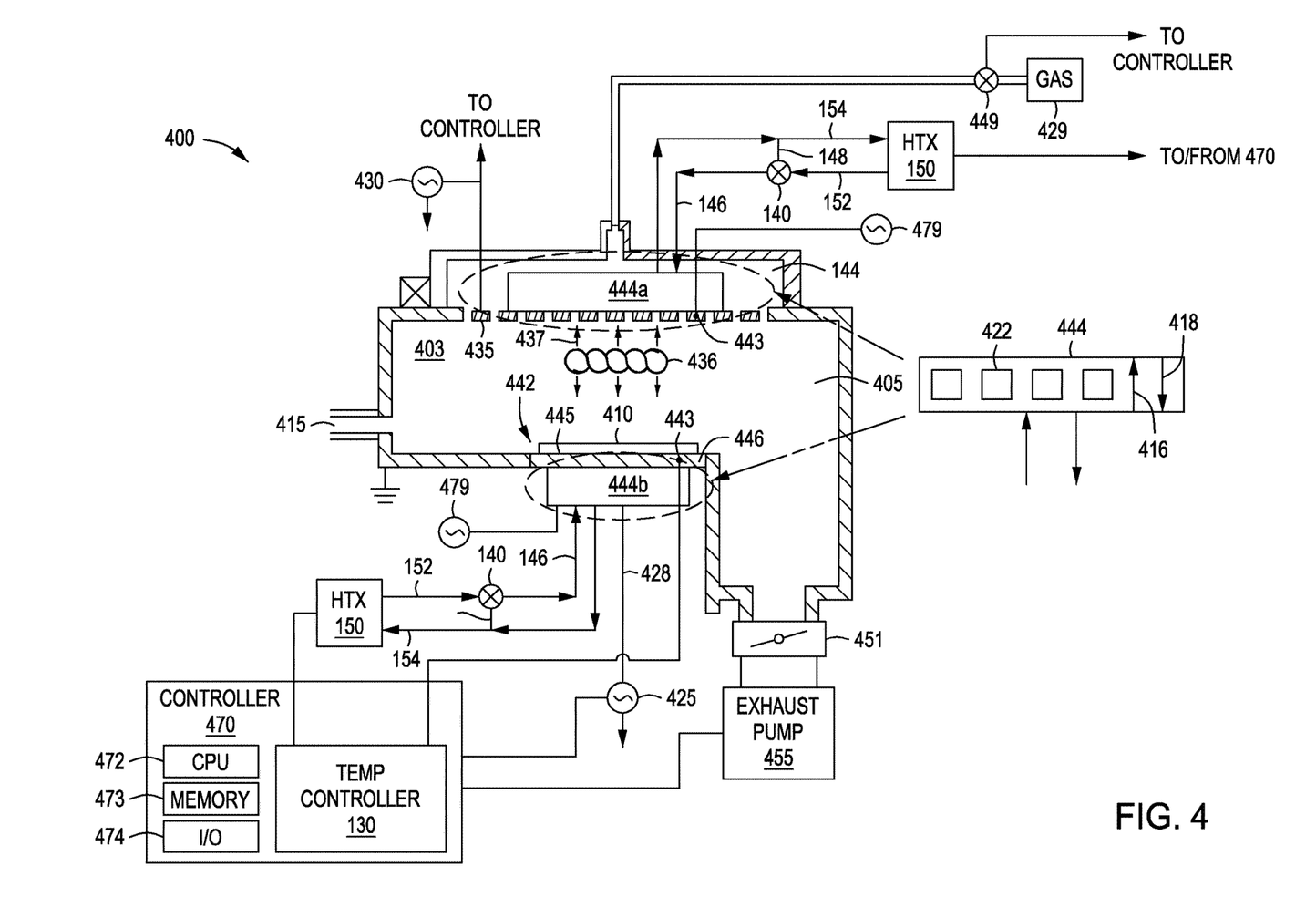
FIG. 4 is a schematic diagram of a plasma system, in accordance with at least some embodiments of the present disclosure.

FIG. 4 is a schematic of a plasma system 400 (system 400), in accordance with at least some embodiments of the present disclosure. The system 400 can be configured to perform one or more plasma processes on a substrate. For example, the system 400 can be configured to perform a physical deposition process, a chemical vapor deposition process, an atomic layer deposition process, an etch process, etc. For example, in at least some embodiments, the system 400 can be configured to perform an etch process and can include a process chamber such as one or more of the etch line of apparatus, e.g., CENTRIS®, CENTURA®, PRODUCER®, available from Applied Materials, Inc. Other commercially available etch chambers may similarly utilize the ESCs described herein.

The system 400 includes processing chamber 402 including a chamber body 405, which can be grounded. Process gases are supplied from a gas source(s) 429 connected to the chamber body 405 through a mass flow controller 449 to an inner volume 403 (e.g., a processing region) of the processing chamber 402.

The processing chamber 402 can be evacuated via an exhaust valve 451 connected to a high capacity vacuum pump stack 455. When plasma power is applied to the processing chamber 402, a plasma can be formed in the inner volume 403 over a substrate 410 (e.g., the substrate 106).

A plasma bias power 425 (e.g., RF power source or DC power source) is coupled to an ESC 442 (e.g., the ESC 104) to energize the plasma. In at least some embodiments, the plasma bias source 425 is an RF power source. The plasma bias power 425 can provide bias power at a frequency from about 2 MHz to about 60 MHz, and may be, for example, in the 13.56 MHz band. The plasma bias power 425 can be coupled to an RF match network (not shown) and to a lower electrode (not shown, e.g., a chucking electrode) via a power conduit 428. Additionally, in at least some embodiments, the processing chamber 402 can include a second plasma bias power (not shown, e.g., RF power source or DC power source). For example, if the second plasma source is a second RF power source, the second RF power source can also be connected to the RF match network. The second plasma bias power can operate at about 2 MHz to about 60 MHz. and may be, for example, in the 2 MHz band.

A plasma source power 430 is coupled through another match network (not shown) to provide high frequency source power to inductively or capacitively energize a plasma 436. The plasma source power 430 may have a higher frequency than the plasma bias power 425, such as between 100 and 180 MHz, and may, for example, be in the 162 MHz band. In at least some embodiments, the plasma can be created using one or more gases suitable for performing an etch process. The plasma is directed to a surface of the substrate 410 via, for example, a source 435 (e.g., a showerhead 138).

The substrate 410 can be loaded through an opening 415 defined through the chamber body 405. The substrate 410 (e.g., such as a semiconductor wafer) may be any wafer, substrate, or other material employed in the semi-conductor processing art. The substrate 410 can be loaded onto a top surface of a dielectric layer (or puck) 445 of the ESC 442. A clamp electrode (not shown) can be embedded in the dielectric layer 445 and can be coupled to a source of bias power 479 to provide an electrostatic force to clamp the substrate 410 to the dielectric layer 445.

One or more cooling plates 444 can be provided on one or more components of the processing chamber 402. For illustrative purpose, respective cooling plates 444*a*, 444*b* are shown provided on the source 435 and the ESC 442. As previously described, the cooling plate 444 can include one or more coolant channels 422 (a plurality of coolant channels 422 are shown in the cooling plate 444) that receive coolant via one or more inlet channels 416 and that release the coolant via one or more output channels 418 (arrows are used to illustrate a single inlet channel 416 and output channel 418). In at least some embodiments, the inlet channel 416, which is connected to the coolant supply line 152 of the heat exchanger 150, is connected to the first coolant output line 146 of the PBV 140 for receiving the coolant and the output channel 418 is connected to a coolant return line 154 of the heat exchanger 150, which is connected to the second coolant output line 148 of the PBV 140, as described above.

In at least some embodiments, the each of the cooling plates 444*a*, 444*b* can be connected to the same heat exchanger, as illustrated in FIG. 4. Alternatively, each of the cooling plates 444*a*, 444*b* can be connected to separate heat exchangers.

To facilitate control of the processing chamber 402, the processing chamber 402 includes a controller 470. The controller 470 includes a central processing unit (CPU) 472, which may be one of any form of general-purpose computer processor that can be used in an industrial setting, such as a programmable logic controller (PLC), for controlling various chambers and sub-processors. A memory 473 is coupled to the CPU 472, and the memory 473 can be non-transitory computer readable storage medium and may be one or more of readily available memory such as random access memory (RAM), read only memory (ROM), floppy disk drive, hard disk, or any other form of digital storage, local or remote. Support circuits 474 (e.g., I/O circuits) including one or more of power supplies, clocks, cache, etc. are coupled to the CPU 472 for supporting the processor in a conventional manner. Charged species generation, heating, and other processes are generally stored in the memory 473, typically as software routine. The software routine may also be stored and/or executed by a second CPU (not shown) that is remotely located from the processing chamber 402 being controlled by the CPU 472.

The memory 473 is in the form of computer-readable storage media that contains instructions, that when executed by the CPU 472, facilitates the operation of the processing chamber 402. The instructions in the memory 473 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semi-conductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Additionally, the controller 470 is configured to perform at least the control functions described above with respect to the control systems of FIGS. 1A-3 and includes the temperature controller 130 to execute temperature control algorithms (e.g., temperature feedback control) which can be stored in the memory 473. The temperature controller 130 is coupled to one or more temperature sensors (probes) 443 (e.g., sensors 112 and/or 114), which may be in or on an upper plate 446 of the ESC 442 and in or on the source 435.

The temperature controller 130 is coupled to one or more heat exchangers (HTX)/chillers. For example, in at least some embodiments the temperature controller 130 is coupled to the heat exchanger 150. The flow rate of the thermal fluid or heat transfer fluid (e.g., coolant) through the one or more coolant channels in the cooling plates 444a, 444b of the source 435 and ESC 442 the is controlled by one or more PBVs 140, as described above.

Figure 5:
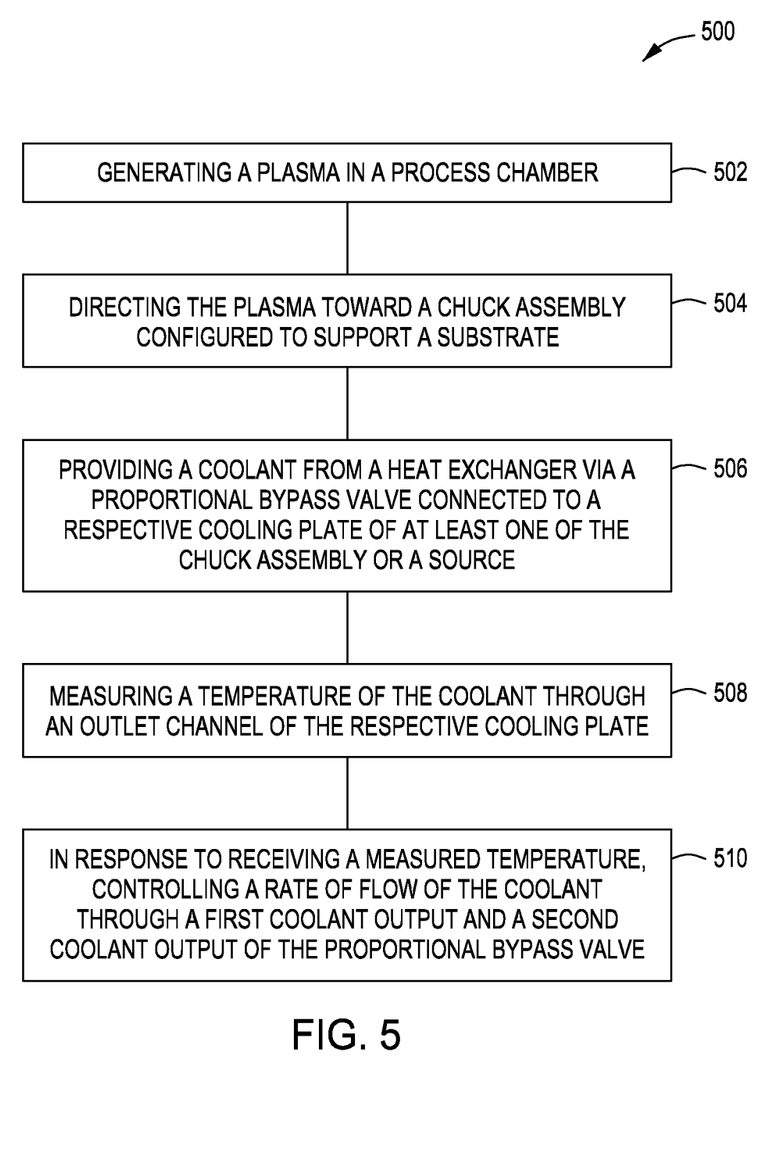
FIG. 5 is a flowchart of a method for processing a substrate, in accordance with at least some embodiments of the present disclosure.

The PBV 140 can be controlled by the temperature controller 130 to independently control a rate of flow of the coolant to each of the one or more coolant channels in the cooling plates 444a, 444b. The temperature controller 130 may also control the temperature set point used by the heat exchanger 150 to cool or heat the thermal fluid. In at least some embodiments, FIG. 5 is a flowchart of a method 500 for processing a substrate, in accordance with at least some embodiments. For illustrative purposes, the method 500 is described in terms of use with the processing chamber 402.

At 502, a plasma (e.g., the plasma 436) can be generated in a processing chamber (e.g., the processing chamber 402). For example, in at least some embodiments, the plasma can be generated using the plasma source power 430 to provide high frequency source power to inductively or capacitively ignite one or more process gases supplied from one or more gas sources (e.g., the gas source 429) to form a plasma.

Next, at 504 the plasma can be directed toward a chuck assembly (e.g., the ESC 442) configured to support a substrate (e.g., the substrate 410). As noted above, as the plasma is directed toward the chuck assembly, heat 437 from the plasma can also be applied/directed to an upper plate of the chuck assembly (and the substrate) and/or a source (e.g., the source 435).

Accordingly, to control a temperature of the upper plate of the chuck assembly and/or the source, at 506 a coolant from a heat exchanger (e.g., the heat exchanger 150) can be provided to the cooling plate of the chuck assembly and/or the source via a PBV connected to the chuck assembly and/or the source. For example, the PBV can be one or more of the previously described PBVs (e.g., the PBV 140).

During processing of the substrate, at 508 a temperature of the coolant through the outlet channel of the cooling plate can be measured. For example, in at least some embodiments, a temperature controller (e.g., the temperature controller 130) can measure a temperature of the coolant through the outlet channel of the cooling plate using, for example, a temperature sensor (e.g., the temperature sensor 443).

Next, at 510, in response to receiving a measured temperature, a rate of flow of the coolant through a first coolant output line and a second coolant output line of the PBV can be continuously controlled. For example, the first coolant output line of the PBV can be controlled to provide a relatively high/low flow rate of coolant through the chuck assembly and/or the source. The flow rate of coolant through the chuck assembly and/or the source is directly proportional to the amount of heat that can transferred from the chuck assembly and/or the source to the coolant, e.g., the higher the flow rate of coolant, the greater the amount of heat that can be transferred. Additionally, the second coolant output line can be controlled to provide a relatively high/low flow rate of coolant to the return line of the heat exchanger, e.g., to cool the coolant prior to the coolant returning to the heat exchanger.

The PBV allows for a plurality of coolant flow capabilities through each of the first output line and second output line of the PBV. Particularly, a flow of the coolant through the PBV can be controlled so that flow through the ports of a valve (e.g., the valve 144) of the PBV can be directed to the first output line and the second output line of the PBV. More particularly, flow output of coolant through the PBV is always 100% (e.g., from about 0 to about 100% through either of the first output line and second output line). For example, in at least some embodiments, 0 to 100% on the port to the first output line has an opposite effect of 100% to 0 on the port to the second output line, to a point where both ports can have a 50/50 split. For example, when the port to the first output line is about 100% (e.g., a fully open configuration), a port to the second output line can be about 0 (e.g., a fully closed configuration), and vice versa.

The temperature controller continually measures/monitors a temperature of the upper plate of the chuck assembly, the source, and/or the coolant through the outlet channel(s) of the cooling plate during processing of the substrate. The temperature controller provides a constant flow of coolant to the cooling plate of the chuck assembly and/or the cooling plate of the source of the processing chamber and the return line of the heat exchanger. Accordingly, when a measured temperature of the upper plate of the chuck assembly, the source, and/or the coolant through the outlet channel(s) of the cooling plate changes (e.g., increases/decreases), the PBV can be controlled to either increase or decrease coolant flow to the processing chamber and/or the return line of the heat exchanger.

For example, when a temperature of the upper plate of the chuck assembly and/or the source is increased (e.g., to a predetermined temperature) as a result the plasma in the processing chamber during processing, the coolant flow can be automatically increased to the chuck assembly and/or the source of the processing chamber using the PBV.

For example, in at least some embodiments, the temperature controller can be configured to control the PBV to automatically increase the coolant flow to the chuck assembly from about 50% to about 75%, and the coolant flow to the heat exchanger can be decreased from 50% to about 25%. When the temperature of the upper plate and/or the substrate of the chuck assembly is decreased (e.g., to a predetermined temperature), the temperature controller can be configured to control the PBV to automatically decrease the coolant flow to the chuck assembly from about 75% back to about 50%, and the coolant flow to the heat exchanger can be increased from 25% back to about 50%. Maintaining a more stable temperature at the upper plate and/or the substrate of the chuck assembly can reduce, if not eliminate, the effects of thermal swing caused by plasma on and off, which can increase processing chamber performance, substrate processing uniformity, and can provide more consistent substrate processing results for a given recipe.

As can be appreciated, the temperature controller can also be configured to control the PBV to automatically increase/decrease the coolant flow to the source in a similar manner.

In at least some embodiments, the temperature controller can be configured to simultaneously and independently control coolant flow to each of the chuck assembly and the source.

When a temperature of the coolant in the return line of heat exchanger is increased (e.g., above a predetermined temperature) as a result of cooling the upper plate and/or the source during processing, the coolant flow can be automatically increased to the return line of the heat exchanger using the PBV. For example, in at least some embodiments, the temperature controller can be configured to control the PBV to automatically decrease the coolant flow to the chuck assembly (and/or the source) from about 50% to about 25%, and the coolant flow to the heat exchanger can be increased from 50% to about 75%. When the temperature of the coolant in the return line is decreased (e.g., to a predetermined temperature), the temperature controller can be configured to control the PBV to automatically increase the coolant flow to the chuck assembly (and/or the source) from about 25% back to about 50%, and the coolant flow to the heat exchanger can be decreased from about 75% back to about 50%. Maintaining a constant temperature of the coolant back to the heat exchanger significantly reduces, if not eliminates, the effects of pressure and flow spikes at the heat exchanger.

In at least some embodiments, the controller can be configured to control the chuck assembly in accordance with one type of control system, and can be configured to control the source in accordance with another type of control system. For example, the controller can be configured to control the chuck assembly in accordance with the control system 100 of FIG. 1A and control the source in accordance with the control system of FIG. 2 or 3, and vice versa.

While the foregoing is directed to embodiments of the present disclosure, other and further embodiments of the disclosure may be devised without departing from the basic scope thereof.

The invention claimed is:

1. A processing chamber, comprising:
   at least one of a chuck assembly or a plasma source including a respective cooling plate, the respective cooling plate including coolant channels having an inlet channel coupled to a coolant supply line of a heat exchanger and an outlet channel that connects to a coolant return line of the heat exchanger;
   a hybrid water interface box (wFib) comprising a coolant supply line and a coolant return line;
   a proportional bypass valve housed within the hybrid water interface box (wFib) and connected between the respective cooling plate and the heat exchanger, the proportional bypass valve including a coolant input line that connects to the coolant supply line of the heat exchanger via the coolant supply line of the hybrid water interface box (wFib), a first coolant output line that connects to the inlet channel of the respective cooling plate separate from coolant supply line of the heat exchanger, and a second coolant output line that connects to the coolant return line via the coolant return line of the hybrid water interface box (wFib);
   a temperature sensor configured to measure a temperature of coolant through the outlet channel of the respective cooling plate; and
   a controller that is configured to receive a measured temperature from the temperature sensor, and in response to receiving the measured temperature is configured to control, via controllable multiple ports on the proportional bypass valve, an individual rate of flow of the coolant through the first coolant output line and the second coolant output line of the proportional bypass valve.

2. The processing chamber of claim 1, wherein the controller is further configured to place the first coolant output line of the proportional bypass valve in a fully open configuration and the second coolant output line of the proportional bypass valve in a fully closed configuration when a substrate is initially being processed.

3. The processing chamber of claim 1, wherein the proportional bypass valve is a first proportional bypass valve, and further comprising a second proportional bypass valve.

4. The processing chamber of claim 3, wherein the inlet channel of the respective cooling plate is a first inlet channel and the respective cooling plate further includes a second inlet channel, wherein each of the first inlet channel and second inlet channel connects to a first coolant output line of the first proportional bypass valve and a first coolant output line of the second proportional bypass valve, respectively, and wherein at least one of a second coolant output line of the first proportional bypass valve or a second coolant output line of the second proportional bypass valve connects to the coolant return line of the heat exchanger.

5. A method of controlling a temperature of components in a processing chamber according to claim 1, the method comprising:
   generating a plasma in the processing chamber using a plasma source;
   directing the plasma toward the chuck assembly, which is configured to support a substrate;
   providing coolant from the heat exchanger via the proportional bypass valve connected to the respective cooling plate of at least one of the chuck assembly or the plasma source;
   measuring the temperature of the coolant through the outlet channel of the respective cooling plate; and
   in response to receiving the measured temperature, controlling the rate of flow of the coolant through the first coolant output line and the second coolant output line of the proportional bypass valve.

6. The method of claim 5, wherein the first coolant output line of the proportional bypass valve is in a fully open configuration and the second coolant output line of the proportional bypass valve is in a fully closed configuration when the substrate is initially being processed.

7. The method of claim 6, wherein controlling the rate of flow of the coolant through the first coolant output line and the second coolant output line of the proportional bypass valve comprises at least one of partially closing the first coolant output line of the proportional bypass valve or partially opening the second coolant output line of the proportional bypass valve.

8. The method of claim 5, wherein the proportional bypass valve is a first proportional bypass valve, and further comprising a second proportional bypass valve.

9. The method of claim 8, wherein the respective cooling plate includes a first inlet channel and a second inlet channel, wherein each of the first inlet channel and second inlet channel connects to a first coolant output line of the first proportional bypass valve and a first coolant output line of the second proportional bypass valve, and wherein at least one of a second coolant output line of the first proportional bypass valve or a second coolant output line of the second proportional bypass valve connects to a coolant return line of the heat exchanger.

10. The method of claim 9, wherein providing the coolant from the heat exchanger comprises providing the coolant to each of the first inlet channel and second inlet channel the respective cooling plate via the first coolant output line of the first proportional bypass valve and the first coolant output line of the second proportional bypass valve, respectively.

11. The method of claim 10, wherein the outlet channel is a first outlet channel and the respective cooling plate comprises a second outlet channel, and further comprising measuring a temperature of the coolant through each of the first outlet channel and the second outlet channel of the respective cooling plate.

12. The method of claim 11, further comprising in response to receiving a measured temperature, controlling a rate of flow of at least one of the coolant through the first coolant output line of the first proportional bypass valve or the first coolant output line of the second proportional bypass valve, and controlling a rate of flow of the coolant through the second coolant output line of the first proportional bypass valve or the second coolant output line of the second proportional bypass valve.

13. A non-transitory computer readable storage medium having instructions stored thereon that when executed by a processor perform a method of controlling a temperature of components in a processing chamber according to claim 1, the method comprising:
generating a plasma in the processing chamber using a plasma source;
directing the plasma toward the chuck assembly, which is configured to support a substrate;
providing coolant from the heat exchanger via the proportional bypass valve connected to the respective cooling plate of at least one of the chuck assembly or the plasma source;
measuring the temperature of the coolant through the outlet channel of the respective cooling plate; and
in response to receiving the measured temperature, controlling the rate of flow of the coolant through the first coolant output line and the second coolant output line of the proportional bypass valve.

14. The non-transitory computer readable storage medium of claim 13, wherein the first coolant output line of the proportional bypass valve is in a fully open configuration and the second coolant output line of the proportional bypass valve is in a fully closed configuration when the substrate is initially being processed.

15. The non-transitory computer readable storage medium of claim 14, wherein controlling the rate of flow of the coolant through the first coolant output line and the second coolant output line of the proportional bypass valve comprises at least one of partially closing the first coolant output line of the proportional bypass valve or partially opening the second coolant output line of the proportional bypass valve.

16. The non-transitory computer readable storage medium of claim 13, wherein the proportional bypass valve is a first proportional bypass valve, and further comprising a second proportional bypass valve.

17. The non-transitory computer readable storage medium of claim 16, wherein the respective cooling plate includes a first inlet channel and a second inlet channel, wherein each of the first inlet channel and second inlet channel connects to a first coolant output line of the first proportional bypass valve and a first coolant output line of the second proportional bypass valve, and wherein at least one of a second coolant output line of the first proportional bypass valve or a second coolant output line of the second proportional bypass valve connects to a coolant return line of the heat exchanger.

18. The non-transitory computer readable storage medium of claim 7, wherein providing the coolant from the heat exchanger comprises providing the coolant to each of the first inlet channel and second inlet channel of the respective cooling plate via the first coolant output line of the first proportional bypass valve and the first coolant output line of the second proportional bypass valve, respectively.

19. The non-transitory computer readable storage medium of claim 18, wherein the outlet channel is a first outlet channel and the respective cooling plate comprises a second outlet channel, and further comprising measuring a temperature of the coolant through each of the first outlet channel and the second outlet channel of the respective cooling plate.

* * * * *